United States Patent [19]

Tsunoda et al.

[11] Patent Number: 4,529,783
[45] Date of Patent: Jul. 16, 1985

[54] COPOLYMER AND PHOTOSENSITIVE MATERIAL CONTAINING THE SAME

[75] Inventors: Takahiro Tsunoda; Tsuguo Yamaoka, both of Funabashi; Akira Ohmori, Ibaraki; Nobuyuki Tomihashi, Takatsuki; Sinji Tamaru, Suita, all of Japan

[73] Assignee: Daikin Kogyo Company, Ltd., Osaka, Japan

[21] Appl. No.: 502,750

[22] Filed: Jun. 9, 1983

[30] Foreign Application Priority Data

Jun. 9, 1982 [JP] Japan .................. 57-98997

[51] Int. Cl.$^3$ ........................... C08F 214/18
[52] U.S. Cl. .................. 526/246; 204/159.18; 430/281
[58] Field of Search ........................ 526/246

[56] References Cited

U.S. PATENT DOCUMENTS 3,544,537  12/1970  Brace .................. 526/246
4,424,325  1/1984  Tsunoda et al. .......... 526/246

*Primary Examiner*—Harry Wong, Jr.
*Attorney, Agent, or Firm*—Armstrong, Nikaido, Marmelstein & Kubovcik

[57] ABSTRACT

A copolymer comprising (a) units of a fluorine-containing acrylic monomer having a general formula

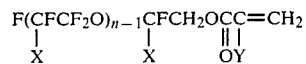

wherein X is F or CF$_3$, Y is H or CH$_3$, n is an integer of 2 to 7, and (b) units of an ethylenically unsaturated monomer having a photosensitive group. The copolymer has an excellent photosensitivity and excellent water and oil repellent properties, and is useful for example as a photosensitive material for dry offset printing plate or resist and as a photo-curable, water and oil repelling coating material.

5 Claims, No Drawings

COPOLYMER AND PHOTOSENSITIVE MATERIAL CONTAINING THE SAME

This invention relates to a novel fluorine-containing copolymer, photosensitive material containing the copolymer and dry offset printing plate using the material as a photosensitive layer.

A fluoroalkyl acrylate copolymer is hitherto known to be useful as a water and oil repelling agent for fibers. In recent years, it is attempted to use a fluoroalkyl acrylate homopolymer or copolymer as a material of an offset printing plate, as proposed in Japanese Unexamined Patent Publication (Tokkyo Kokai) No. 74404/1977 in which a film of the homopolymer or copolymer is formed on a support such as aluminum plate to provide an offset ink repelling layer. In such an offset printing plate, an oleophilic image area for carrying an offset ink thereon is formed on the layer by handwriting letters or pictures with an oleophilic ink such as marking ink, ball pen or carbon ink or by typewriting them. In another printing plate, an oleophilic photoconductive layer is further provided between the support and the ink repelling layer, and an oleophilic image area is formed by imagewise perforating the ink repelling layer with electric discharge or by forming a toner image on the ink repelling layer in a usual electrophotographic manner. However, these offset printing plates do not provide a sufficiently resolved image and, therefore, the image is lacking in resolving power or sharpness. These plates also have the disadvantage that the printing durability is not sufficient because the adhesive property of the ink repelling layer is poor in the imaged portion.

It is an object of the present invention to provide a fluorine-containing copolymer useful as a photosensitive material.

Another object of the present invention is to provide a dry offset printing plate without necessity of dampening water which can form an image of good resolving power in a simple manner and moreover has an excellent printing durability.

These and other objects of the present invention will become apparent from the following description.

The present invention provides a novel fluorine-containing copolymer comprising (a) units of a monomer having a general formula

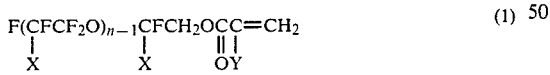

wherein X is F or CH$_3$, Y is H or CH$_3$, n is an integer of 2 to 7, and (b) units of an ethylenically unsaturated monomer having a photosensitive group, a photosensitive material containing the copolymer, and a dry offset printing plate comprising an ink repelling layer of the photosensitive material and a support.

The copolymer of the present invention is sensitive to light, and can be cured by exposure to light so as to become insoluble in an organic solvent. The copolymer also has an excellent oil repellent property, and accordingly is very useful as a photosensitive material for dry offset printing plate.

The copolymer of the present invention is prepared by copolymerizing the fluorine-containing acrylic monomer of the formula (1), the monomer having a photosensitive group and, when desired, other copolymerizable vinyl monomer.

Various groups can be used as photosensitive groups of the monomer (b). Useful examples are as follows:

(1) Azidobenzoyloxy groups of the formula

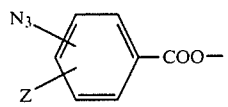

wherein Z is H, alkyl having 1 to 5 carbon atoms, alkoxyl having 1 to 5 carbon atoms, nitro, chlorine atom or bromine atom, (2) Cinnamic acid residue of the formula

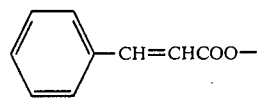

(3) Benzoylphenyl group of the formula

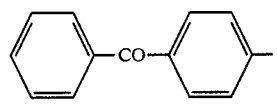

(4) Groups containing α,β-unsaturated ketone residue of the formula

but the photosensitive groups are not limited to them.

The photosensitive groups containing the above α,β-unsaturated ketone residue include, for instance, cinnamoylphenyl group of the formula

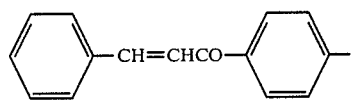

benzoylethylenylenephenyl group of the formula

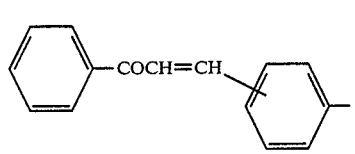

2'-methoxy-4'-(1-butene-3-onyl)-phenyl group of the formula

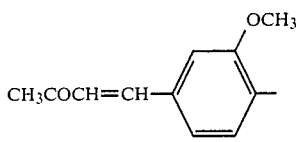

benzoylethylenylenebenzoyloxy group of the formula

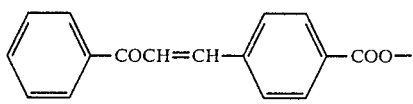

cinnamoyl groups of the formula

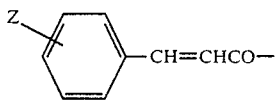

wherein Z is H, alkyl having 1 to 5 carbon atoms, alkoxyl having 1 to 5 carbon atoms, nitro, chlorine atom or bromine atom, but the groups are not limited to them.

Preferable monomers (b) having the azidobenzoyloxy group are compounds of the formula

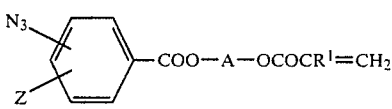

wherein Z is as defined above, A is a bivalent organic group, $R^1$ is H or $CH_3$. The azido group may be attached to any of ortho-, meta- and para-positions of the benzene ring, and the para-position is particularly preferred. A is a group which links azidobenzoyloxy group to acryl group and is not limited. A may be various bivalent organic groups if not affecting these groups. Preferable examples of A is a bivalent hydrocarbon residue or those in which one of hydrogen atoms is substituted by hydroxyl group or halogen atom except for fluorine atom, such as chlorine or bromine atom. The hydrocarbon residue preferably has 1 to 5 carbon atoms, more preferably 1 to 3 carbon atoms. Examples of such monomers are the following methacrylates and the corresponding acrylates.

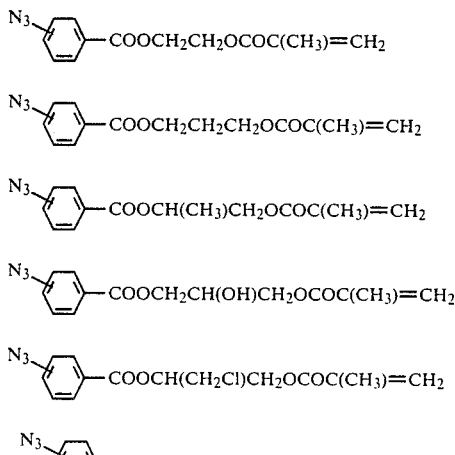

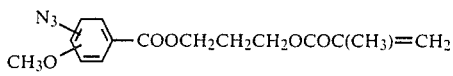

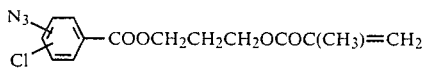

Preferred examples of monomers having cinnamic acid residue are those represented by the formula

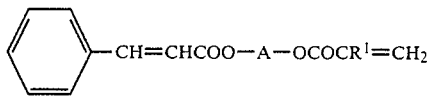

wherein A and $R^1$ are as defined above. Examples of such monomers are the following methacrylates and the corresponding acrylates.

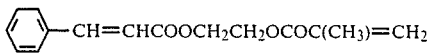

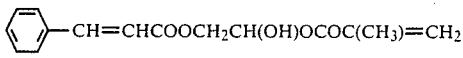

Preferable examples of monomers having benzoylphenyl group are compounds represented by the formula

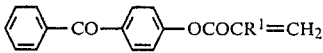

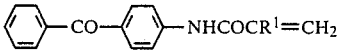

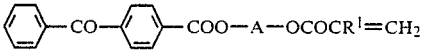

wherein A and $R^1$ are as defined above. Examples of such monomers are the following methacrylates and the corresponding acrylates.

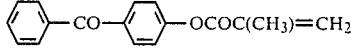

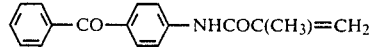

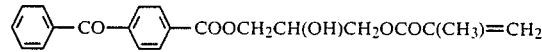

Further, preferable examples of monomers having a group containing $\alpha,\beta$-unsaturated ketone residue are compounds represented by the formula

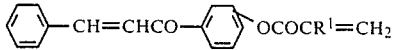

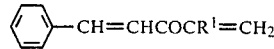

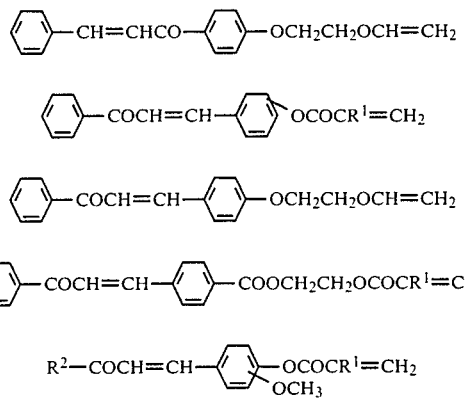

wherein $R^1$ is H or $CH_3$, $R^2$ is $CH_3$, $C_2H_5$ or $C_6H_5$.

The vinyl monomers used, when desired, in the present copolymer include, for instance, an ethylenically unsaturated olefin such as ethylene, propylene, butylene, isobutylene or butadiene, a styrene compound such as styrene, α-methylstyrene or p-chlorostyrene, an unsaturated carboxylic acid such as acrylic acid, methacrylic acid, itaconic acid, maleic acid or maleic anhydride, an α-methylene aliphatic monocarboxylic acid ester such as methyl acrylate, ethyl acrylate, n-butyl acrylate, isobutyl acrylate, dodecyl acrylate, n-octyl acrylate, 2-chloroethyl acrylate, phenyl acrylate, methyl α-chloroacrylate, methyl methacrylate, ethyl methacrylate, butyl methacrylate or ethyl α-ethylacrylate, a vinyl ether such as vinyl methyl ether, vinyl ethyl ether or vinyl isobutyl ether, a vinyl ester such as vinyl chloride, vinyl acetate, vinyl propionate, vinyl butyrate or vinyl benzoate, an ethylene derivative such as 1-methyl-1′-methoxyethylene, 1,1′-dimethoxyethylene, 1,1-dimethoxyethylene, 1,1′-dimethoxycarbonylethylene or 1-methyl-1′-nitroethylene, a N-vinyl compound such as N-vinylpyrrole, N-vinylcarbazole, N-vinylindole, N-vinylpyrrolidine or N-vinylpyrrolidone, acrylonitrile, methacrylonitrile, acrylamide, methacrylamide, α-ethylacrylamide, acrylic acid anilide, p-chloroacrylic acid anilide, m-nitroacrylic acid anilide, m-methoxyacrylic acid anilide, vinylidene chloride and vinylidene cyanide.

According to the invention, the polymerization is usually carried out by a solution polymerization or emulsion polymerization process, and particularly the solution polymerization is preferable, since the copolymer having more excellent solubility and sensitivity is obtained.

As a solvent in the polymerization, there is used a good solvent for the produced copolymer such as m-xylene hexafluoride, trichlorotrifluoroethane, tetrachlorohexafluorobutane, or dimer and trimer of hexafluoropropene.

Peroxides and aliphatic azo compounds used in a usual solution polymerization may be used as a polymerization initiator, and particularly azobisisobutyronitrile (AIBN) and benzoyl peroxide (BPO) are preferable. Also, the polymerization temperature is preferably from 45° to 70° C.

It is preferable that the copolymer of the invention contains at least 20 mole %, especially at least 40 mole % of the fluorine-containing acrylic monomer, and at least 5 mole %, especially at least 10 mole % of the monomer having a photosensitive group. At the above content range, the copolymer is excellent in the photosensitivity and ink-repellent property, hence particularly suitable for forming images on a dry offset printing plate without necessity of dampening water.

The copolymer is supported in the form of film on a support to provide a dry offset printing plate. An image can be easily formed, for instance, by bringing a positive film into close contact with a photosensitive layer of the printing plate, exposing to light such as ultraviolet rays and developing with a solvent.

As a support, there is used, for instance, metal plates such as aluminum plate, zinc plate and iron plate, papers, and plastic films having a good dimensional stability such as polyester film.

The photosensitive layer (repellent layer) of the printing plate is formed by preparing a solution of the copolymer in an organic solvent, if necessary, to which a sensitizer may be added, coating uniformly the solution onto a support and drying it. The thickness of the photosensitive layer is, for instance, from 2 to 20 μm.

Usual graphic arts light sources such as a high pressure mercury lamp and a xenon lamp are employed as a light source for the exposure of the photosensitive layer. The development is conducted by dissolving the unexposed area with an organic solvent as mentioned before, and whereby the surface of the support at the unexposed area appears and the exposed area remains undissolved to leave as an image because the polymer is cured. The thus formed image strongly repels an oil printing ink, and accordingly provides a practical offset printing plate which can be used without dampening water.

The offset printing plate of the present invention has the advantages (1) that the cured portion has a good repellent property to an oil ink, (2) that plate making procedure is simple, and (3) that the adhesiveness between the cured portion and a support and the mechanical strength of the cured portion are excellent. Therefore, the imaged printing plate does not require the use of dampening water in printing and also has excellent sharpness and printing durability.

The copolymer of the present invention are useful for other purposes as well as dry offset printing plate. By utilizing an excellent photosensitivity, it is possible to provide paper and other substrates with a photo-curable coating, and for instance, by further utilizing the water and oil repellent properties, the copolymer can be employed as a water and oil repelling coating. The copolymer is also usable as a resist for producing a negative fine pattern by exposure to X-rays, electron beams or far ultraviolet rays.

The present invention is more particularly described and explained by means of the following Examples.

EXAMPLE 1

(1) Preparation of 2-cinnamoyloxyethyl methacrylate

In 46 g. of pyridine was dissolved 19 g. of 2-hydroxyethyl methacrylate, and 25 g. of cinnamic acid chloride was gradually added to the solution with vigorously stirring and cooling the reaction vessel with ice-cold water. After the addition, the reaction was continued for 8 hours at room temperature. The reaction mixture was poured into 200 ml. of water, and the separated liquid was extracted with ether. The ether layer was dried with anhydrous sodium sulfate and filtered, and ether was then removed under reduced pressure to give 33 g. of 2-cinnamoyloxyethyl methacrylate in the form of light yellow liquid. The identification was conducted by elemental analysis, infrared spectrum and nuclear magnetic resonance spectrum.

(2) Preparation of copolymer

A 200 ml. glass ampule was charged with the following mixture.

| m-Xylene hexafluoride | 100 ml. |
| --- | --- |
| F(CFCF$_2$O)$_3$CFCH$_2$OCC=CH$_2$<br>   \|         \|       \|\| \|<br>  CF$_3$    CF$_3$    OCH$_3$<br>(hereinafter referred to as "23FO") | 0.035 mole |
| 2-Cinnamoyloxyethyl methacrylate | 0.015 mole |
| AIBN | 0.1 g. |

The mixture was frozen by liquid nitrogen, and after degassing for 30 minutes by a vacuum pump, was fused at room temperature. These freezing, degassing and fusing procedures were conducted twice, and after freezing the mixture and degassing for 30 minutes again, the ampule was sealed.

After fusing the frozen mixture in the ampule at room temperature, the ampule was placed in an oil bath and the polymerization was carried out at 60° C. for 4.5 hours. After the polymerization, the mixture was added to n-hexane with agitation, and the precipitate was filtered with a glass filter and washed with n-hexane and dried under reduced pressure at room temperature.

The obtained precipitate was subjected to infrared spectrum analysis. The infrared spectrum indicated the absorption based on the carbonyl group of 23FO at 1,740 cm$^{-1}$ and the absorption based on the ethylenically unsaturated group of cinnamoyl group at 1,665 cm$^{-1}$.

EXAMPLE 2

A copolymer was prepared in the same manner as in Example 1 except that the following mixture was employed for the polymerization.

| m-Xylene hexafluoride | 100 ml. |
| --- | --- |
| 23FO | 0.035 mole |
| p-Azidobenzoic acid ester of 2-hydroxyethyl methacrylate (hereinafter referred to as "2HEM-ABA") | 0.015 mole |
| AIBN | 0.1 g. |

The infrared spectrum of the obtained copolymer indicated the absorption based on the carbonyl group of 23FO at 1,740 cm$^{-1}$ and the absorption based on the carbonyl group of p-azidobenzoic acid in 2HEM-ABA at 1,720 cm$^{-1}$.

EXAMPLE 3

A copolymer was prepared in the same manner as in Example 1 except that p-benzoylphenyl acrylate (hereinafter referred to as "BPA") was used in place of 2-cinnamoyloxyethyl methacrylate. The infrared spectrum of the obtained copolymer showed the absorption based on the carbonyl group of 23FO at 1,740 cm$^{-1}$ and the absorption based on the stretching vibration of diaryl ketone at 1,660 cm$^{-1}$.

EXAMPLE 4

A copolymer was prepared in the same manner as in Example 1 with the exception of using F(CFCF$_2$O)$_2$CFCH$_2$OCC=CH$_2$
   \|         \|       \|\| \|
  CF$_3$    CF$_3$    OCH$_3$ (hereinafter referred to as "17FO") and

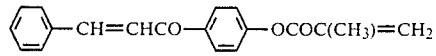

as monomers (a) and (b).

The infrared spectrum of the obtained copolymer indicated the absorption based on the carbonyl group of 17FO at 1,740 cm$^{-1}$ and the absorption based on the cinnamoylphenyl group at 1,650 cm$^{-1}$.

EXAMPLE 5

A copolymer was prepared in the same manner as in Example 2 except that 0.030 mole of 23FO and 0.005 mole of 2-hydroxyethyl methacrylate (hereinafter referred to as "HEM") were used in place of 0.035 mole of 23FO.

The infrared spectrum of the obtained copolymer showed the absorption based on the carbonyl group of 23FO at 1,740 cm$^{-1}$, the absorption based on the carbonyl group of p-azidobenzoic acid in 2HEM-ABA at 1,720 cm$^{-1}$ and the absorption based on the OH group of HEM at 3,400 cm$^{-1}$.

EXAMPLE 6

A copolymer was prepared in the same manner as in Example 1 except that

F(CFCF$_2$O)$_4$CFCH$_2$OCCH=CH$_2$
   \|         \|       \|\|
  CF$_3$    CF$_3$    O was used in place of 23FO.

The infrared spectrum of the obtained copolymer indicated the absorption of the carbonyl group of the above acrylate at 1,740 cm$^{-1}$ and the absorption based on the ethylenically unsaturated group of cinnamoyl group at 1,665 cm$^{-1}$.

EXAMPLES 7 TO 12

Six photosensitive coating solutions were prepared according to the following formulation.

| m-Xylene hexafluoride (solvent) | 100 ml. |
| --- | --- |
| Copolymer obtained in each of Examples 1 to 6 (photosensitive material) | 5 g. |
| 5-Nitroacenaphthene (sensitizer) | 0.1 g. |

Each of the solution was applied to the smooth surface of an aluminum plate by a spin coater at 200 r.p.m., and was dried to give a film having a thickness of 2 μm.

In order to examine the stain with ink of the ground of the obtained photosensitive plate, the polymer layer was exposed to light in its whole surface and then developed with m-xylene hexafluoride to obtain a plate in which the whole surface thereof was covered with the fluorine-containing polymer. The plate was then set at a master cylinder portion of TOKO Offset Printing Machine Type-810 (Tokyo Koku Keiki Co., Ltd., Japan). The printing was carried out with feeding ink but without feeding water and paper, and stopped at a prescribed rotation number. The deposited ink was transferred to a paper and the ink repellent property was evaluated by measuring a relative reflectivity of the paper to a white paper. As inks, SP Highness Black (usual offset ink) and WLP-Black S (dry offset ink) which are products of Osaka Ink Co., Ltd., Japan, were employed. For comparison, a reflectivity was measured in the same manner as above except that a copolymer was used which was prepared by employing the following compounds as monomers (a) and (b).

Comparative Example 1

| | |
|---|---|
| $F(CF_2CF_2)_4CH_2CH_2OCC=CH_2$<br>$\quad\quad\quad\quad\quad\quad\quad\quad\;\; \| \;\;\|$<br>$\quad\quad\quad\quad\quad\quad\quad\quad\; O\;\; OCH_3$<br>(17F) | 0.035 mole |
| 2-Cinnamoyloxyethyl methacrylate | 0.015 mole |

TABLE 1

| | Reflectivity (%) | | | |
|---|---|---|---|---|
| | SP Highness Black | | WLP-Black S | |
| | 500 times | 2000 times | 500 times | 2000 times |
| Example 7 | 13 | 8 | 78 | 82 |
| 8 | 12 | 11 | 71 | 89 |
| 9 | 8 | 10 | 88 | 89 |
| 10 | 7 | 6 | 71 | 63 |
| 11 | 12 | 10 | 81 | 79 |
| 12 | 9 | 10 | 88 | 93 |
| Comparison 1 Example | 2 | 1 | 43 | 48 |

EXAMPLE 13

Test for printing durability:

A positive film of halftone image of 200 lines/inch was superposed on the coated surface of the photosensitive plate obtained in Example 7, and the plate was exposed to light from a 20 W chemical lamp for 5 minutes at a distance of 10 cm. Developmemt was then conducted with m-xylene hexafluoride to dissolve and remove the unexposed area, thereby causing the aluminum surface to appear. The exposed polymer remained on the aluminum surface without being dissolved to give an image composed of the fluorine-containing polymer.

The plate was then attached to an offset printing machine from which a roll for feeding dampening water was detached, and printing was carried out without dampening water by employing a usual offset ink (KOF-Hup, product of Moroboshi Ink Co., Ltd., Japan). The ink stuck to only the exposing aluminum surface without sticking to the polymer film portion of the plate. The printing was continued until 20,000 sheets of printed matters were produced. The quality of the later impression was the same as that of the first impression, and 5 to 95% halftone dots of 200 lines/inch was completely reproduced.

We claim:

1. A copolymer comprising (a) units of a fluorine-containing acrylic monomer having a general formula

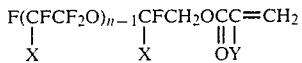

wherein X is F or $CF_3$, Y is H or $CH_3$, n is an integer of 2 to 7, and (b) units of an ethylenically unsaturated monomer having a photosensitive group, wherein said photosensitive group is selected from the following;

(1) azidobenzoyloxy groups of the formula

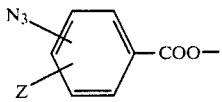

wherein Z is H, alkyl having 1 to 5 carbon atoms, alkoxyl having 1 to 5 carbon atoms, nitro, chlorine atom or bromine atom, (2) cinnamic acid residue of the formula

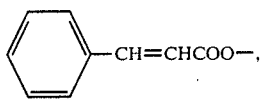

(3) benzoylphenyl group of the formula

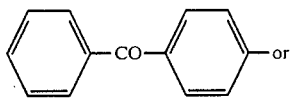

(4) groups containing α,β-unsaturated ketone residue of the formula —COCH=CH—.

2. A copolymer as defined in claim 1 wherein the content of the component (a) is at least 20 mole % and that of the component (b) is at least 5 mole %.

3. A copolymer as defined in claim 1 wherein the α,β-unsaturated ketone residue is cinnamoylphenyl group of the formula

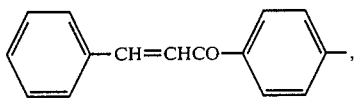

benzoylethylenylenephenyl group of the formula

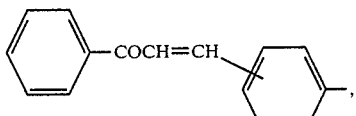

2'-methoxy-4'-(1-butene-3-onyl)-phenyl group of the formula

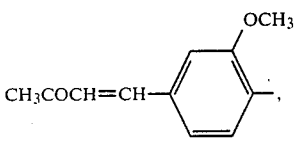

benzoylethylenylenebenzoyloxy group of the formula

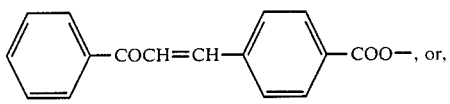

cinnamoyl groups of the formula

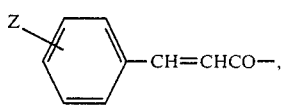

wherein Z is H, alkyl having 1 to 5 carbon atoms, alkoxyl having 1 to 5 carbon atoms, nitro, chlorine atom or bromine atom.

4. A copolymer as defined in claim 1 wherein the ethylenically unsaturated monomer having a photosensitive group is an unsaturated ketone of the formula

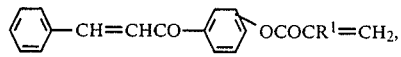

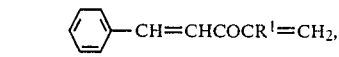

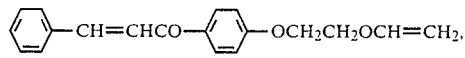

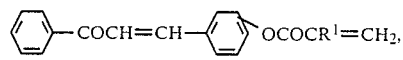

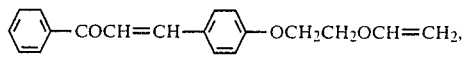

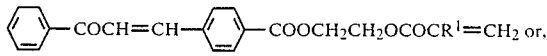

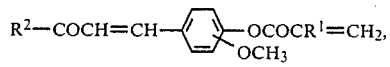

wherein $R^1$ is H or $CH_3$, $R^2$ is $CH_3$, $C_2H_5$ or $C_6H_5$.

5. A photosensitive material which comprises as the main component in the formation thereof a copolymer according to claim 1.

* * * * *